(12) United States Patent

Matsunami

(10) Patent No.: US 7,834,673 B2
(45) Date of Patent: Nov. 16, 2010

(54) VARIABLE DELAY CIRCUIT AND DELAY AMOUNT CONTROL METHOD

(75) Inventor: Hiroyuki Matsunami, Kasugai (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 12/342,780

(22) Filed: Dec. 23, 2008

(65) Prior Publication Data

US 2009/0160520 A1 Jun. 25, 2009

(30) Foreign Application Priority Data

Dec. 24, 2007 (JP) ............................. 2007-331244

(51) Int. Cl.
*H03H 11/26* (2006.01)
(52) U.S. Cl. .................. 327/276; 327/99; 327/278; 327/299
(58) Field of Classification Search ......... 327/276–278, 327/281, 298, 99, 269–271
See application file for complete search history.

(56) References Cited

U.S. PATENT DOCUMENTS

| 5,727,021 A | * | 3/1998 | Truebenbach | ............... 375/226 |
| 5,801,562 A | | 9/1998 | Fujii | |
| 6,049,239 A | | 4/2000 | Eto et al. | |
| 6,204,710 B1 | * | 3/2001 | Goetting et al. | ............. 327/276 |
| 6,518,812 B1 | * | 2/2003 | Sikkink et al. | .............. 327/284 |
| 6,836,166 B2 | * | 12/2004 | Lin et al. | .................... 327/158 |
| 7,576,585 B2 | * | 8/2009 | Asano et al. | ................. 327/276 |

FOREIGN PATENT DOCUMENTS

| JP | 6-10547 U | 3/1994 |
| JP | 9-46196 A | 2/1997 |
| JP | 9-46197 A | 2/1997 |
| JP | 3739525 B | 11/2005 |
| JP | 2006-186547 A | 7/2006 |

* cited by examiner

*Primary Examiner*—An T Luu
(74) *Attorney, Agent, or Firm*—Fujitsu Patent Center (57) ABSTRACT

A variable delay circuit comprising a first delay element configured to delay an input signal, a second delay element coupled to the first delay element in parallel and also configured to delay the input signal, a control current supply section configured to supply control currents for adjusting a delay amount of the first delay element and a delay amount of the second delay element, and an output signal selecting section configured to select any one of an output signal from the first delay element and an output signal from the second delay element according to a selecting signal for selecting delay time of the input signal.

14 Claims, 7 Drawing Sheets

VARIABLE DELAY CIRCUIT AND DELAY AMOUNT CONTROL METHOD

CROSS-REFERENCE TO RELATED APPLICATIONS

This application claims the benefit of priority of Japanese Patent Application No. 2007-331244 filed on Dec. 24, 2007, the entire contents of which are incorporated herein by reference.

BACKGROUND

1. Field

The present application relates to a variable delay circuit and a delay amount control method.

2. Description of the Related Art

In general, in order to adjust a phase of an input signal, a delay circuit which delays an input signal by a substantially constant time is used.

Japanese Patent No. 3739525 discusses a variable delay circuit which has a first gate line, a second gate line and a plurality of switches. The first gate line is configured so that a plurality of first gates is coupled in series each other and a signal is input thereinto. The second gate line is configured so that a plurality of second gates whose delay time is different from a delay time of the first gate line are coupled in series each other. A signal delayed from the former signal is input thereinto. A plurality of switches is provided between intermediate nodes of the first gate line and corresponding intermediate nodes of the second gate line.

According to the aforementioned typical technology, when one of the plurality of switches is closed, setting intervals of delay time of the input signal changes according to a difference between delay time of the first gate and delay time of the second gate according to the number of times of passing through the first gate and the second gate. When the delay time of the first gate and the delay time of the second gate are made to be variable, the setting intervals of the delay times of the input signals change.

Japanese Patent Application Laid-Open No. 9-46196 discusses a variable delay circuit which has a first path which supplies a signal, which is inputted into an input terminal, to an output terminal, and a delay time variable second path which supplies a signal, which is input into the input terminal, to the output terminal. The second path has a function for changing delay time according to a delay time control signal. The aforementioned typical variable delay circuit selects any one of the first path and the second path according to a select signal.

According to the variable delay circuit in Japanese Patent Application Laid-Open No. 9-46196, since the delay time of the second path arbitrarily varies according to the delay time control signal, resolution power of the delay time is not limited to a specified value. According to the aforementioned typical variable delay circuit, the delay time is suitably determined by the delay time control signal, so that the resolution power of the delay time is determined to a desired value.

Japanese Patent Application Laid-Open No. 9-46197 discusses a variable delay circuit which determines a resolution power of delay time to a desired value. The aforementioned typical variable delay circuit has a plurality of delay circuits and a selector. A clock signal input into a clock input terminal, and a data signal input into a data input terminal are supplied to the plurality of delay circuits, and each of delay time of the plurality of delay circuits is difference. The selector is coupled to the plurality of delay circuits, and outputs any one of outputs from the plurality of delay circuits to a data output terminal according to a select signal.

According to the aforementioned typical variable delay circuit, the plurality of delay circuits output signals whose phases are various. When different delay circuits are selected according to the select signal, the delay time of the variable delay circuit varies according to phase difference of the output signals from the selected delay circuits.

According to the background technology in Japanese Patent Application Laid-Open No. 2006-186547, a input signal is input into the variable delay circuit which includes a minute delay section and a rough delay section are coupled in series, and a signal having any delay amount with respect to the input signal is generated.

According to the aforementioned typical technology, the minute delay section is configured so that a buffer, an additional capacity and a switch are coupled in a multi-stage. In the minute delay section, when the switch is turned on, the delay amount is increased by the additional capacity. The delay amount of the minute delay section per stage increases in comparison with the case where the switch is off.

In the rough delay section, a path which is provided with a CMOS buffer having gate delay in a multi-stage and a path which does not have gate delay are switched by each selector. As a result, the delay amount is set for each selector based on switches of each selector.

According to the aforementioned typical technology, in order to generate delay of 11 ns, for example, delay of 1 ns is generated by the minute delay section, and delay of 10 ns is generated by the rough delay section. The resolution power of the delay time becomes higher than the case where delay is generated only by the rough delay section.

Besides the aforementioned typical technology, Japanese Utility Model Application Laid-Open No. 6-10547 discusses a technology relating to a typical variable delay circuit.

According to the aforementioned typical technology, element property of the first gate, the element property of the second gate, and/or element property of the delay elements which is includes in the delay circuits influence the delay time of the first gate, the second gate and/or the delay time of the delay circuits.

According to the aforementioned typical technology, delay time is determined by a total value of the delay time of the first gate and the delay time of the second gate, or the delay time of the variable delay circuit is determined according to the delay time of the delay elements which is includes in the delay circuits. Therefore, the delay time of the variable delay circuit depends on the shortest delay time of the first and second gates.

SUMMARY

At least one embodiment of the present invention relates to a variable delay circuit that comprises a first delay element delaying an input signal, a second delay element coupled to the first delay element in parallel and delaying the input signal, a control current supply section supplying control currents for adjusting a delay amount of the first delay element and a delay amount of the second delay element, and an output signal selecting section selecting any one of an output signal from the first delay element and an output signal from the second delay element according to a selecting signal for selecting delay time of the input signal.

BRIEF DESCRIPTION OF THE DRAWINGS

Embodiments are illustrated by way of example and not limited by the following figures.

DETAILED DESCRIPTION OF THE EMBODIMENTS

In the figures, dimensions and/or proportions may be exaggerated for clarity of illustration. It will also be understood that when an element is referred to as being "coupled to" another element, it may be directly connected or indirectly coupled, i.e., intervening elements may also be present. Further, it will be understood that when an element is referred to as being "between" two elements, it may be the only element layer between the two elements, or one or more intervening elements may also be present.

Figure 1:
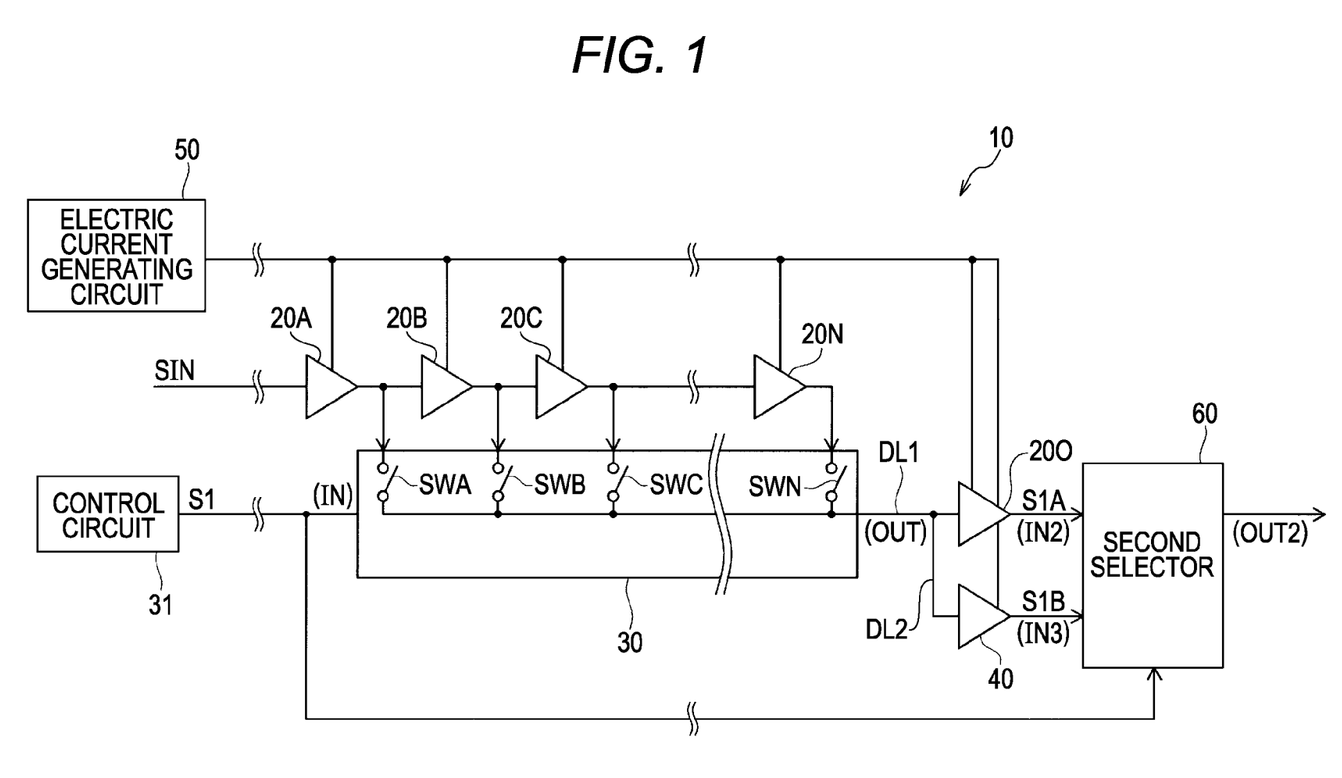
FIG. 1 illustrates a delay circuit, according to an example of an embodiment of the present invention.

FIG. 1 illustrates a delay circuit 10 that includes gates 20A to 20N, a gate 20O, a first selector 30, a gate 40, an electric current generating circuit 50, and a second selector 60.

As shown in FIG. 1, N number of gates 20A to 20N is coupled in series. Delay times of the gates 20A to 20N may be set to, for example, 100 ps.

As further shown in FIG. 1, the first selector 30 includes N number of switches SWA to SWN. The switch SWA is coupled between an output of the gate 20A and an output terminal (OUT). The switches SWB to SWN are respectively coupled between outputs of the gates 20B to 20N and the output terminal (OUT) similarly to the switch SWA. The switches SWA to SWN are coupled to a control circuit 31 via a signal input terminal (IN). The N number of gates 20A to 20N and a delay adjusting section including the first selector 30 may be electrically coupled to an output terminal of the second selector 60.

Figure 2:
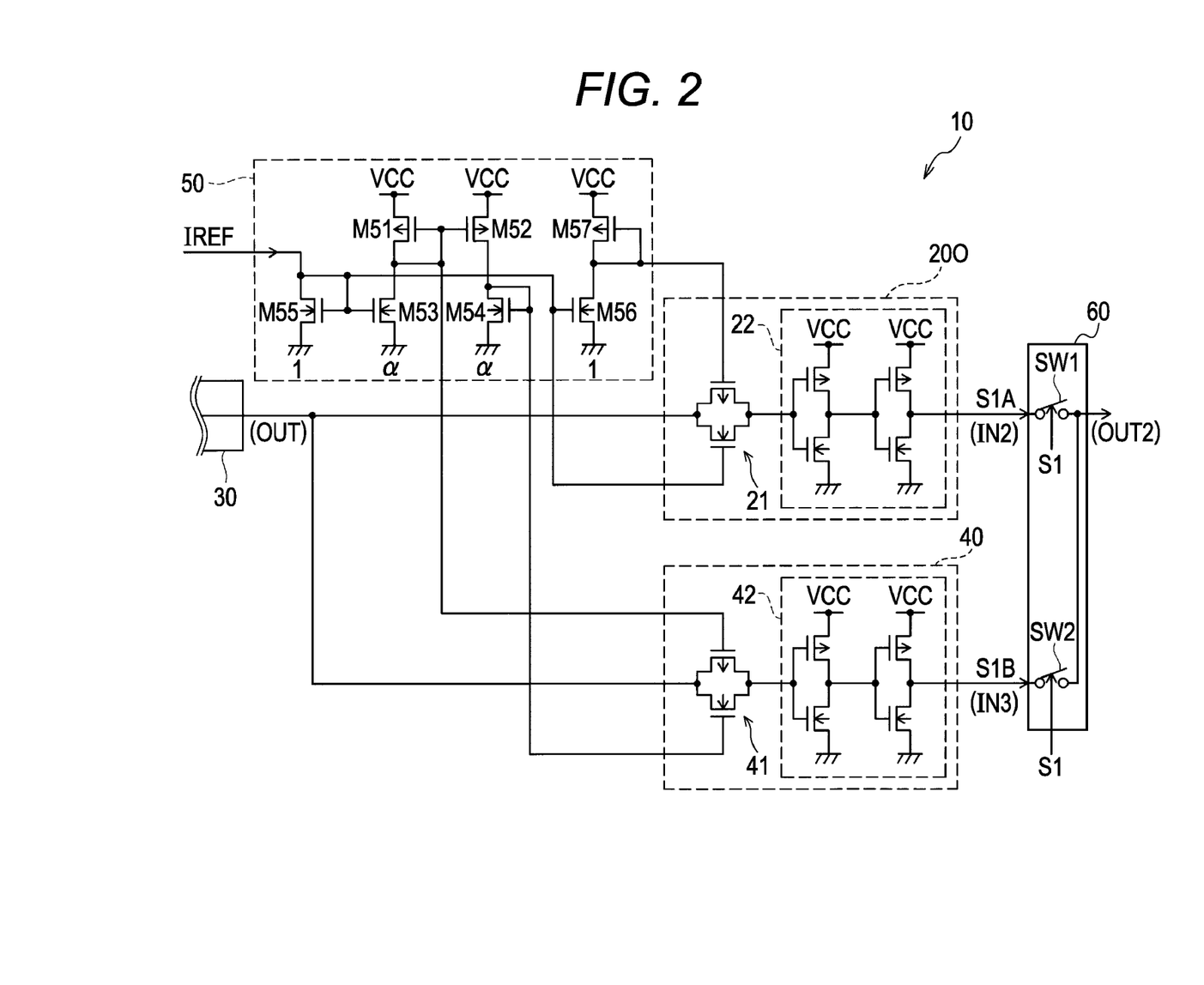
FIG. 2 illustrates a part of the delay circuit as shown in FIG. 1, according to an example of an embodiment of the present invention.

FIG. 2 illustrates a part of the delay circuit as shown in FIG. 1. As shown in FIG. 2, the gate 20O includes a transfer gate 21 and a buffer 22. An input of the buffer 22 is coupled to an output terminal (OUT) of the first selector 30 via the transfer gate 21 and an input of the gate 20O.

As further shown in FIG. 2, the gates 20A to 20N include the transfer gate 21 and the buffer 22 similarly to the gate 20O. Delay time of the gate 20O may be set to, for example, 100 ps similarly to the gates 20A to 20N. The gate 20O may correspond to, for example, a first delay element. The transfer gate 21 which is included in the gates 20A to 20N may correspond to, for example, a second transfer gate. The buffer 22 which is included in the gates 20A to 20N may correspond to, for example, a third buffer circuit.

As further shown in FIG. 2, the gate 40 includes a transfer gate 41 and a buffer 42. An input of the buffer 42 is coupled to the output terminal (OUT) of the first selector 30 via the transfer gate 41 and an input of the gate 40.

As further shown in FIG. 2, the electric current generating circuit 50 includes P-type channel transistors M51 and M52, N-type channel transistors M53 to M56, and a P-type channel transistor M57. The electric current generating circuit 50 is coupled to the gates 20O and 40. As not shown, the electric current generating circuit 50 is coupled to the gates 20A to 20N similarly to the gates 20O and 40.

As further shown in FIG. 2, a current mirror circuit includes the P-type channel transistor M51 and the P-type channel transistor M52. Sources of the P-type channel transistors M51 and M52 are coupled to a power supply voltage VCC. A drain of the P-type channel transistor M51 is coupled to a drain of the N-type channel transistor M53. A source of the N-type channel transistor M53 is coupled to a ground.

As further shown in FIG. 2, a gate and the drain of the P-type channel transistor M51 are coupled. The gate of the P-type channel transistor M51 is coupled to the gate of the P-type channel transistor M52. The gates of the transistors M51 and M52 are coupled to a P-type channel transistor included in the transfer gate 41 of the gate 40.

As further shown in FIG. 2, a drain of the P-type channel transistor M52 is coupled to a drain of the N-type channel transistor M54. A source of the N-type channel transistor M54 is coupled to a ground. A gate and the drain of the N-type channel transistor M54 are coupled. The gate of the P-type channel transistor M54 is coupled to an N-type channel transistor which is included in the transfer gate 41.

As further shown in FIG. 2, another current mirror circuit includes the N-type channel transistor M55 and the N-type channel transistor M53. A drain of the N-type channel transistor M55 is coupled to a substantially constant current source which supplies the reference current IREF in FIG. 3. A source of the N-type channel transistor M55 is coupled to a ground. A gate and the drain of the N-type channel transistor M55 are coupled. The gate of the N-type channel transistor M55 is coupled to a gate of the N-type channel transistor M53.

Figure 3:
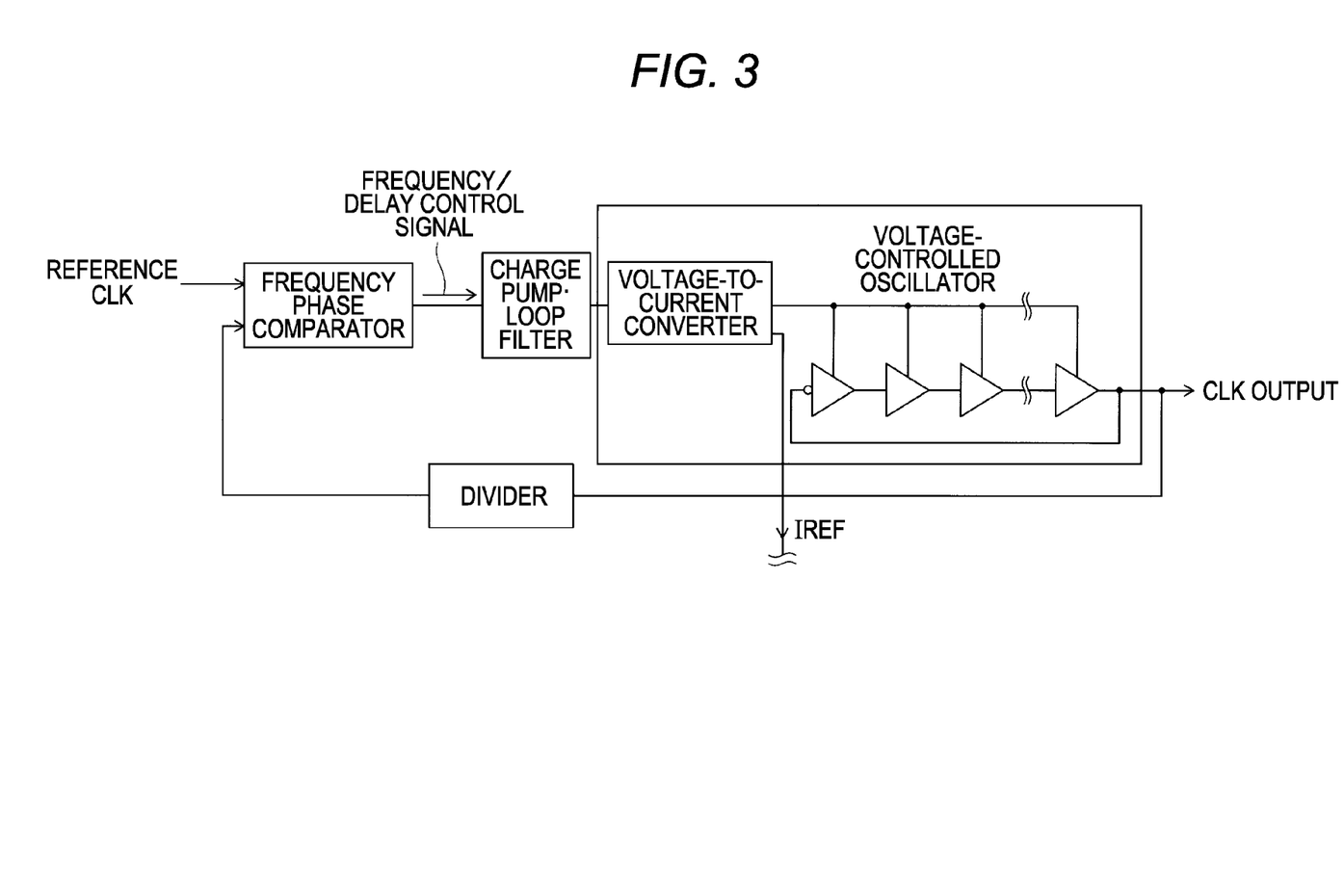
FIG. 3 illustrates a substantially constant current source which supplies a reference current IREF, according to an example of an embodiment of the present invention.

As shown in FIG. 3, the substantially constant current source, which supplies the reference current IREF, includes a phase locked loop (PLL). The phase locked loop includes a frequency phase comparator, a charge pump, a loop filter, a voltage controlled oscillator (VCO) and a divider.

A reference signal (reference CLK) and a divided signal are input into the frequency phase comparator of FIG. 3. The divided signal is a signal which is obtained by dividing an output signal (CLK output) from the voltage-controlled oscillator using the divider. The frequency phase comparator detects a phase difference between the reference signal and the divided signal, and outputs a frequency/delay control signal.

As further shown in FIG. 3, a generated voltage by the change pump/loop filter is controlled according to the frequency/delay control signal. The generated voltage of the charge pump/loop filter is output to a voltage-to-current converting circuit of the voltage-controlled oscillator. The voltage-to-current converting circuit outputs a reference current IREF according to the generated voltage by the charge pump/loop filter. In the phase locked loop, the frequency phase comparator detects a phase difference between the reference signal and the division signal, and a frequency of the output signal (CLK output) is controlled so as to be a value obtained by multiplying a frequency of the standard signal by a division ratio of the divider.

As further shown in FIG. 2, the gates of the transistors M55 and M53 are coupled to a gate of the N-type channel transistor included in the transfer gate 21 of the gate 20O. A current mirror circuit includes the N-type channel transistor M55 and the N-type channel transistor M56. The gates of transistors M53 and M55 are coupled to a gate of the N-type channel transistor M56. A source of the N-type channel transistor M56 is coupled to a ground.

As further shown in FIG. 2, a source of the P-type channel transistor M57 is coupled to the power supply voltage VCC. A gate and a drain of the P-type channel transistor M57 are coupled. The drain of the P-type channel transistor M57 is coupled to a drain of the N-type channel transistor M56. The gate of the P-type channel transistor M57 is coupled to a gate of the P-type channel transistor included in the transfer gate 21.

As further shown in FIG. 2, the second selector 60 includes a switch SW1 and a switch SW2. The switch SW1 is coupled between a first input terminal (IN2) of the second selector 60 and an output terminal (OUT2) of the second selector 60. The first input terminal (IN2) of the second selector 60 is coupled to an output of the gate 20O.

As further shown in FIG. 2, the switch SW2 is coupled between a second input terminal (IN3) of the second selector 60 and the output terminal (OUT2) of the second selector 60. The second input terminal (IN3) of the second selector 60 is coupled to an output of the gate 40.

Figure 4:
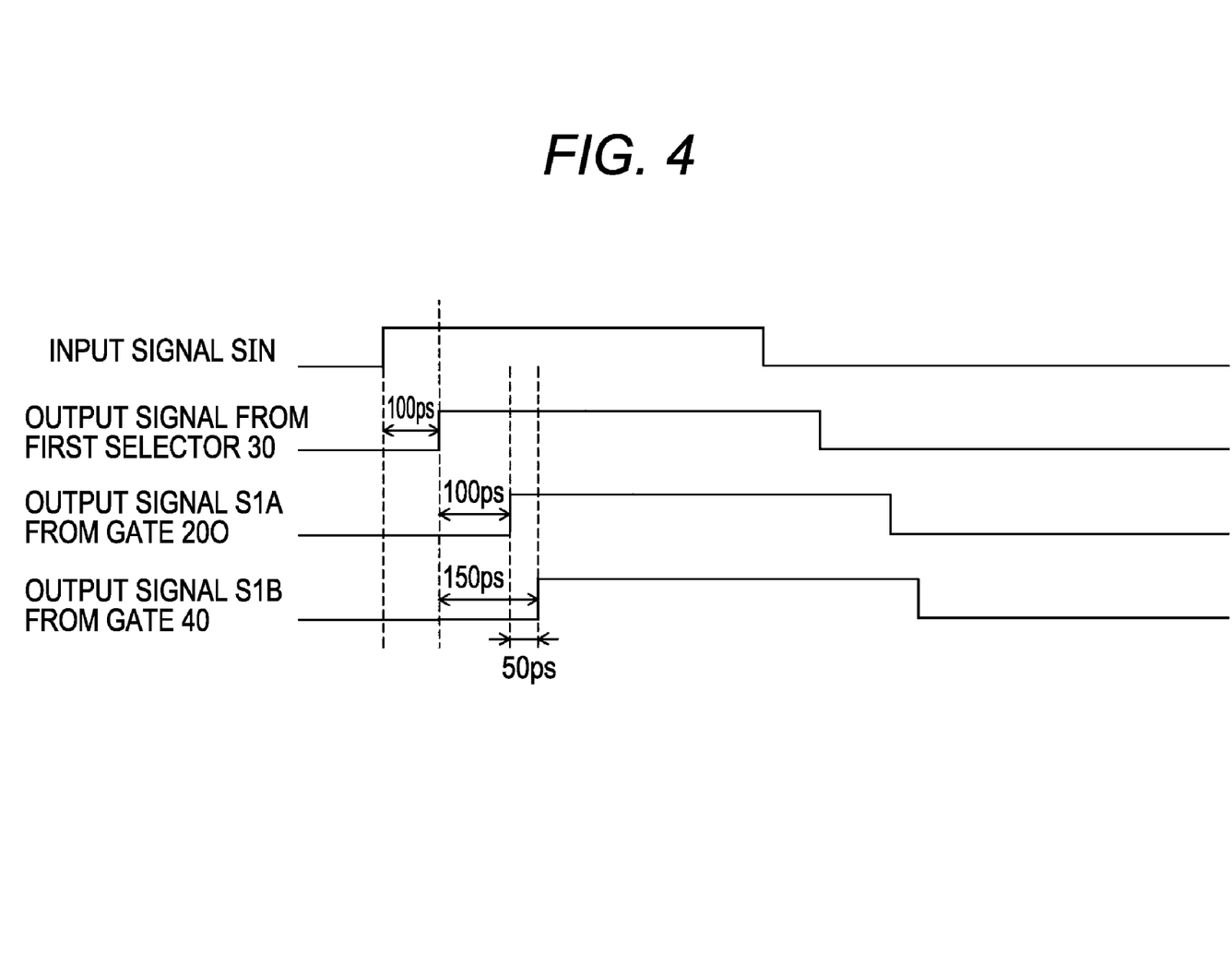
FIG. 4 illustrates a timing chart explaining an operation of a delay circuit, according to an example of an embodiment of the present invention.

FIG. 4 illustrates a timing chart explaining an operation of a delay circuit, such as the delay circuit illustrated in FIG.1. As shown in FIG. 4, the delay time of the gate 20O may be set to, for example, 100 ps, and the delay time of the gate 40 may be set to, for example, 150 ps. The following describes an operation in the case where the switch SWA of the first selector 30 is selected so as to be closed by a delay time setting signal S1 output from the control circuit 31 in FIG. 1, and the switches SWB to SWN are in an open state. The delay time setting signal S1 may correspond to, for example, a delay time selecting signal.

As further shown in FIG. 4, an input signal SIN is input into the gate 20A in FIG. 1. The input signal SIN input into the gate 20A passes from the output of the gate 20A through the output terminal (OUT) of the first selector 30 in FIG. 1 via the switch SWA. When the input signal SIN is input into the gate 20A in FIG. 1, the signal is output from the output terminal (OUT) of the first selector 30 in FIG. 1 after only 100 ps passes.

As further shown in FIG. 2, the output signal of the first selector 30 in FIG. 1 passes through the gate 20O. In the electric current generating circuit 50 of FIG. 2, the gate of the N-type channel transistor M55 is coupled to the gate of the N-type channel transistor M56 and the gate of the N-type channel transistor included in the transfer gate 21. A size (L/W, gate length/gate width) of the N-type channel transistor M55 may be set to, for example, a size (L/W) of the N-type channel transistor M56. In the electric current generating circuit 50, a predetermined voltage is commonly applied to the gates of the N-type channel transistors M55 and M56, the gate of the N-type channel transistor which is included in the transfer gate 21, and the gate of the P-type channel transistor which is included in the transfer gate 21 according to electric currents generated by the N-type channel transistors M55 and M56 based on the reference current IREF and the size. The control of gate voltages of the N-type and P-type transistors of the transfer gate 21 causes an ON-resistance of the transfer gate 21 to change. A conduction state of the transfer gate 21 is controlled based on the ON-resistance of the transfer gate 21. The electric current generating circuit 50 may correspond to, for example, a control current supply section, and the electric currents generated by the N-type channel transistors M55 and M56 may correspond to, for example, a control current.

As further shown in FIG. 2, in the gate 20O, time for delaying an output signal from the first selector 30 (for example, 100 ps) is set according to the conduction state of the transfer gate 21. In the gate 20O, change time of the input voltage to the buffer 22 is controlled according to the conduction state of the transfer gate 21. As a result, time for which the input voltage to the buffer 22 exceeds a threshold voltage of the buffer 22 is adjusted, so that the delay time in the gate 20O may be set to, for example, 100 ps. When a signal is input into the gate 20O in FIG. 2, a signal is output from the gate 20O to the first input terminal (IN2) of the second selector 60 after only 100 ps passes.

In the delay circuit as illustrated in FIG. 1, a signal path DL1 from the output of the gate 20A via the switch SWA and the gate 20O to the first input terminal (IN2) of the second selector 60 may correspond to, for example, a delay stage (first delay line). Also, the element structure of the gates 20A to 20O may be substantially identical to the element structure of a plurality of gates to be used for a ring oscillator of the voltage controlled oscillator in FIG. 3. The reference current IREF which is generated based on an oscillating frequency of the voltage-controlled oscillator is supplied to the gates 20A to 20O and the plurality of gates to be used for the ring oscillator. The delay times of the gates 20A to 20O and the plurality of gates to be used for the ring oscillator are controlled so as to be substantially constant according to the reference current IREF.

For example, when the ring oscillator is formed by 20-stage gates and the oscillating frequency of the ring oscillator is 250 MHz, an oscillation cycle is 2 ns (=1/[2×250 MHz]). The delay time of one stage gate is 100 ps (2 ns/20 stages). The delay times of the gates 20A to 20O are controlled so as to be 100 ps according to the reference current IREF which is output when the phase locked loop in FIG. 3 is locked.

As further shown in FIG. 2, the output signal from the first selector 30 passes through the gate 20O and the gate 40. In the electric current generating circuit 50, a ratio of the size (L/W) of the N-type channel transistor M55 to the size (L/W) of the N-type channel transistor M53 may be set to 1:α (α<1). Further, a ratio of the size (L/W) of the N-type channel transistor M55 to the size (L/W) of the N-type channel transistor M54 may be set to 1:α (α<1). In the electric current generating circuit 50, a predetermined voltage is commonly applied to the gate of the N-type channel transistor included in the transfer gate 41 and the gate of the P-type channel transistor according to the electric current(s) generated by the N-type channel transistor(s) M53 and/or M54 based on the reference current IREF and the set size ratio (1:α). As a result, the control of the gate voltages of the N-type and P-type transistors of the transfer gate 41 causes an ON-resistance of the transfer gate 41 to change. The conduction state of the transfer gate 41 is controlled based on the ON-resistance of the transfer gate 41. The N-type channel transistors M53 and M54 may correspond to, for example, an output transistor. The generation of the electric currents using the N-type channel transistors M53 and M54 may correspond to, for example, the supply of the control current.

As further shown in FIG. 2, the voltages to be given to the gates of the N-type and P-type transistors of the transfer gate 41 may be set to values lower than the voltages to be given to the gates of the N-type and P-type transistors of the transfer gate 21. In the gate 40, the time for delaying the output signal from the first selector 30 (for example, 150 ps) is set according to the conduction state of the transfer gate 41. In the gate 40, the change time of the input voltage to the buffer 42 is controlled according to the conduction state of the transfer gate 41. As a result, the time for which the input voltage to the buffer 42 exceeds a threshold voltage of the buffer 42 is adjusted, and the delay time in the gate 40 is set to 150 ps.

As further shown in FIG. 4, when a signal is input into the gate 40, a signal is output from the gate 40 to a second input terminal (IN3) of the second selector 60 after 150 ps passes. A signal path DL2 from the output of the gate 20A via the switch SWA and the gate 40 to the second input terminal (IN3) of the second selector 60 may correspond to, for example, a delay stage (second delay line). The gate 40 may correspond to, for example, a second delay element.

The gate 40 may correspond to, for example, a first buffer circuit and a first transfer gate. The transfer gate 41 may correspond to, for example, a control voltage generating section and the first buffer circuit.

As further shown in FIG. 2, when the switch SW1 of the second selector 60 is closed by the delay time setting signal S1 and the switch SW2 is in an open state, an output signal S1A from the gate 20O shown in FIG. 1, 2 or 4 passes through the output terminal (OUT2) of the second selector 60 via the switch SW1. The output signal S1A from the gate 20O corresponds to an output signal from the first delay line (first delay element). The generation of the output signal S1A by the signal path DL1 may correspond to, for example, a first delay operation. The passing of the output signal S1A through the output terminal (OUT2) of the second selector 60 via the switch SW1 according to the delay time setting signal S1 may correspond to, for example, an output signal selecting operation.

As further shown in FIG. 2, when the switch SW2 of the second selector 60 is closed by the delay time setting signal S1 and the switch SW1 is in the open state, an output signal S1B from the gate 40 in FIG. 1, 2 or 4 passes through the output terminal (OUT2) of the second selector 60 via the switch SW2. The output signal S1B of the gate 40 corresponds to an output signal from a second delay line (second delay element). The generation of the output signal S1B by the signal path DL2 may correspond to, for example, a second delay. The passing of the output signal S1B via the switch SW2 through the output terminal (OUT2) of the second selector 60 according to the delay time setting signal S1 may correspond to, for example, output signal selection. The second selector 60 may correspond to, for example, an output signal selecting section.

As further shown in FIG. 4, when any one of the switches SW1 and SW2 is closed and the other switch is maintained in the open state by the delay time setting signal S1 in FIG. 2, the delay time of the signal passing through the output terminal (OUT2) of the second selector 60 is adjusted with a delay interval (150 ps–100 ps=50 ps) according to a difference value between the delay time (150 ps) of the gate 40 and the delay time (100 ps) of the gate 20O.

When the second selector 60 selects any one of the output signal S1A from the gate 20O and the output signal S1B from the gate 40 according to the delay time setting signal S1 in FIG. 2, the delay time of the gate 20O which is included in the signal path DL1 is different from the delay time of the gate 40 which is included in the signal path DL2. For this reason, timing at which a signal delayed from an input signal SIN is selected by the second selector 60 changes.

The delay time of the signal passing through the output terminal (OUT2) of the second selector 60 changes according to a difference in the timing at which the signal delayed from the input signal SIN is selected by the second selector 60.

The delay time of the gate 40 (for example, 150 ps) may be set to a value which is not more than twice the delay time of the gate 20O (for example, 100 ps). In this case, the difference value (50 ps) between the delay time of the gate 40 and the delay time of the gate 20O becomes smaller than shortest delay time (100 ps) of the gate 20O. Therefore, the delay time of the signal passing through the output terminal (OUT2) of the second selector 60 is adjusted with a smaller interval than the shortest delay time (100 ps) of the gate 20O according to the difference value (50 ps).

According to a control method, for example, relating to the delay circuit illustrated in FIG. 1, when any one of the output signal S1A from the gate 20O and the output signal S1B from the gate 40 is selected by the delay time setting signal S1 in FIG. 2, the delay time of the gate 20O which is included in the signal path DL1 is different from the delay time of the gate 40 which is included in the signal path DL2. For this reason, the delay changes depending on selection between the signal delayed from the input signal SIN based on the signal path DL1 and the signal delayed from the input signal SIN based on the signal path DL2. The delay time of the signal passing through the output terminal (OUT2) of the second selector 60 changes according to the selection between these signals delayed from the input signal SIN.

For this reason, when the delay time (for example, 150 ps) of the gate 40 may be set to a value which is not more than twice the delay time (for example, 100 ps) of the gate 20O, the difference value (50 ps) between the delay time of the gate 40 and the delay time of the gate 20O becomes smaller than the shortest delay time (100 ps) of the gate 20O. Therefore, the delay time of the signal passing through the output terminal (OUT2) of the second selector 60 is adjusted with smaller interval than the shortest delay time (100 ps) of the gate 20O according to the difference value (50 ps).

The electric current generating circuit 50 in FIG. 2 may include the N-type channel transistors M55, M53 and M54 which generate electric currents according to a set size ratio $\alpha$ ($\alpha<1$) for the reference current IREF. The voltage applied to the transfer gate 41 of the gate 40 may be different from the voltage applied to the transfer gate 21 of the gate 20O with the N-type channel transistors M53 and M54 and the P-type channel transistor M51.

When the electric current according to the set ratio $\alpha$ (((1) for the reference current IREF is generated, the voltage applied to the transfer gate 41 of the gate 40 may be different from the voltage applied to the transfer gate 21 of the gate 20O according to the generated electric current.

The transfer gate 41 of the gate 40 controls an input voltage of the buffer 42 coupled to the input terminal (IN3) of the second selector 60 according to the electric currents generated by the N-type channel transistors M55, M53 and M54 of the electric current generating circuit 50 in FIG. 2. When the On-resistance of the transfer gate 41 is changed by the electric currents generated by the N-type channel transistors M55, M53 and M54 of the electric current generating circuit 50, the time for which the input voltage of the buffer 42 exceeds the threshold voltage of the buffer 42 changes, and the time for which the signal input into the gate 40 is output from the gate 40 to the second input terminal (IN3) of the second elector 60 changes.

Similar to the gate 20O, when the gates 20A to 20N include the transfer gate 21 and the buffer 22, the ON-resistance of the transfer gate 21 and the time for which the input voltage of the buffer 22 exceeds the threshold voltage of the buffer 22 are adjusted in the gates 20A to 20N similarly to the gate 20O. The ON-resistance of the transfer gate 21 and the time for which the input voltage of the buffer 22 exceeds the threshold voltage of the buffer 22 in the gates 20A to 20N are adjusted similarly to the gate 20O, and the delay times of the gates 20A to 20N match the delay time of the gate 20A.

Figure 5:
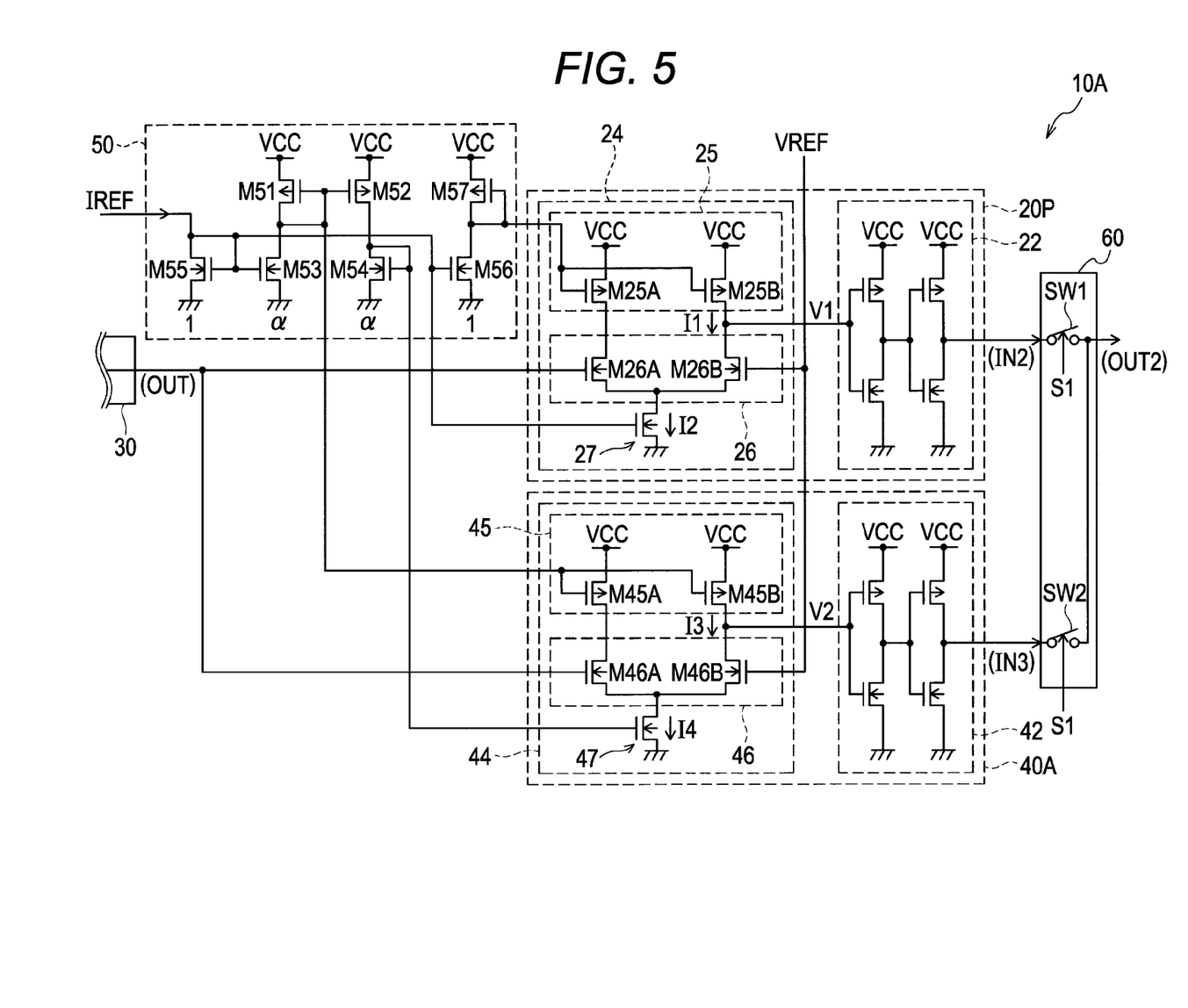
FIG. 5 illustrates a part of a delay circuit, according to an example of another embodiment of the present invention.

FIG. 5 illustrates a part of an alternative delay circuit. The delay circuit 10A includes a gate 20P and a gate 40A instead of the gate 20O in FIG. 2 and the gate 40 in FIG. 2.

As shown in FIG. 5, the gate 20P includes a differential circuit 24 and the buffer 22. The differential circuit 24 includes a load current source transistor 25, a differential input transistor 26, and a differential current source transistor 27.

As further shown in FIG. 5, the load current source transistor 25 includes P-type channel transistors M25A and M25B. Gates of the P-type channel transistors M25A and M25B are coupled to the gate and the drain of the P-type channel transistor M57 of the electric current generating circuit 50.

As further shown in FIG. 5, the differential input transistor 26 includes N-type channel transistors M26A and M26B. A drain of the N-type channel transistor M26A is coupled to a drain of the P-type channel transistor M25A. A drain of the N-type channel transistor M26B is coupled to a drain of the P-type channel transistor M25B. A coupling point between the drain of the N-type channel transistor M26 and the drain of the P-type channel transistor M25B is coupled to the input of the buffer 22.

As further shown in FIG. 5, a drain of the differential current source transistor 27 is coupled to a source of the N-type channel transistor 26A and a source of the N-type channel transistor M26B. A gate of the differential current source transistor 27 is coupled to the gate of the N-type channel transistor M56, the gate and the drain of the N-type channel transistor M55. A source of the differential current source transistor 27 is coupled to a ground.

As further shown in FIG. 5, the gate 40A includes a differential circuit 44 and the buffer 42. The differential circuit 44 includes a load current source transistor 45, a differential input transistor 46 and a differential current source transistor 47. The load current source transistor 45 corresponds to an electric current source transistor. The differential input transistor 46 may correspond to, for example, a differential circuit. The differential current source transistor 47 may correspond to, for example, a differential current source transistor. The buffer 42 may correspond to, for example, a second buffer circuit.

As further shown in FIG. 5, the load transistor 45 includes P-type channel transistors M45A and M45B. Gates of the P-type channel transistors M45A and M45B are coupled to the gates of the P-type channel transistors M51 and M52 of the electric current generating circuit 50 and the drain of the N-type channel transistor M53.

As further shown in FIG. 5, the differential input transistor 46 includes N-type channel transistors M46A and M46B. A drain of the N-type channel transistor M46A is coupled to a drain of the P-type channel transistor M45A. A drain of the N-type channel transistor M46B is coupled to a drain of the P-type channel transistor M45B. A coupling point between the drain of the N-type channel transistor M46B and the drain of the P-type channel transistor M45B is coupled to the input of the buffer 42.

As further shown in FIG. 5, a drain of the differential current source transistor 47 is coupled to a source of the N-type channel transistor M46A and a source of the N-type channel transistor M46B. A gate of the differential current source transistor 47 is coupled to the gate and the drain of the N-type channel transistor M54. A source of the differential current source transistor 47 is coupled to a ground.

An operation of the delay circuit as illustrated in FIG. 5 is now described. Similar to the delay circuit as illustrated in FIG.1, the delay time of the gate 20P may be set to 100 ps, and the delay time of the gate 40A may be set to 150 ps. Also similar to the delay circuit as illustrated in FIG.1, the operation in the case where the switch SWA of the first selector 30 is closed is described below.

The input signal SIN in FIG. 5 passes through the output terminal (OUT) of the first selector 30 via the output of the gate 20A and the switch SWA (as similarly described earlier with reference to FIG. 2). The output signal from the first selector 30 passes through the gate 20P. The gate 20P performs the following operation.

In the gate 20P of FIG. 5, when the output signal from the first selector 30 is in a high level, a gate voltage of the N-type channel transistor M26A of the differential input transistor 26 is fixed to a high level. When the gate voltage of the N-type channel transistor M26A is fixed to the high level, an electric current flowing in the N-type channel transistor M26A becomes high.

A voltage which is lower than the high level is applied to a gate of the N-type channel transistor M26B of the differential input transistor 26 based on a reference voltage VREF. As a result, when the voltage lower than the high level is applied to the gate of the N-type channel transistor M26B, an electric current flowing in the N-type channel transistor M26B becomes low.

In the above case, a high-level voltage V1 is output to the buffer 22 from the coupling point between the drain of the P-type channel transistor M25B of the load current source transistor 25 and the N-type channel transistor M26B according to the electric current I1 supplied by the differential current source transistor 25.

The input voltage input into the buffer 22 of FIG. 5 is set according to a conduction state of the load current source transistor 25. The conduction state of the load current source transistor 25 changes according to an electric current generated by the N-type channel transistor M56 of the electric current generating circuit 50.

A slew rate of the input voltage to the buffer 22 is set according to the electric current generated by the N-type channel transistor M56. The delay time of the gate 20P may be set to 100 ps, for example, by adjusting the time for which the input voltage exceeds the threshold voltage of the buffer 22 under the set slew rate. The signal input into the gate 20P is output from the gate 20P toward the first input terminal (IN2) of the second selector 60 after 100 ps.

When the output signal from the first selector 30 is in a low level, the N-type channel transistor M26A of the differential input transistor 26 is controlled into an off state, so that the electric current flowing in the N-type channel transistor M26 becomes low. A voltage higher than the low level is applied to the gate of the N-type channel transistor M26B of the differential input transistor 26 based on the reference voltage VREF. As a result, a sink current flowing in the ground via the N-type channel transistor M26B of the differential input transistor 26 and the differential current source transistor 27 becomes high. A predetermined voltage is applied to the gate of the differential current source transistor 27 according to an electric current generated by the N-type channel transistor M54 of the electric current generating circuit 50. An electric current I2 flows in the differential current source transistor 27 due to the application of the predetermined voltage, and a low-level voltage V1 is output towards the buffer 22.

An output signal from the first selector 30 passes through the gate 20P and the gate 40A (as similarly described earlier with reference to FIG.1). The gate 40P performs the following operation.

In the gate 40A of FIG. 5, when the output signal from the first selector 30 is in a high level, a gate voltage of the N-type channel transistor M46A of the differential input transistor 46 is fixed to the high level. When the gate voltage of the N-type channel transistor M46A is fixed to the high level, the electric current flowing in the N-type channel transistor M46A becomes high. A voltage lower than the high level is applied to the gate of the N-type channel transistor M46B of the differential input transistor 46 based on the reference voltage VREF. When the voltage lower than the high level is applied to gate of the N-type channel transistor M46B, the electric current flowing in the N-type channel transistor M46B becomes low. In this case, a high-level voltage V2 is output towards the buffer 42 from the coupling point between the drain of the P-type channel transistor M45B of the load current source transistor 45 and the drain of the N-type channel transistor M46B according to an electric current I3 supplied by the differential current source transistor 45.

The input voltage input into the buffer 42 in FIG. 5 is set according to a conduction state of the load current source transistor 45. The conduction state of the load current source transistor 45 changes according to the electric current generated by the N-type channel transistor M53 of the electric current generating circuit 50.

In the electric current generating circuit 50, the slew rate is set by adjusting the time for which the input voltage of the buffer 42 exceeds the threshold voltage according to the electric currents generated by the N-type channel transistors M55 and M53 under the reference current IREF and the set size ratio $\alpha$ ($\alpha<1$).

The ratio of the size of the N-type channel transistor M53 to the size of the N-type channel transistor M56 may be set to $\alpha:1$. The electric current I3 is set to a value smaller than the value of the electric current I1. In this case, the time for which the gate voltage of the N-type channel transistor of the buffer 42 exceeds the threshold voltage is longer than the time for which the gate voltage of the N-type channel transistor of the buffer 22 exceeds the threshold voltage. Therefore, the slew rate of the gate 40A becomes smaller than the slew rate of the gate 20.

The delay time of the gate 40A in FIG. 5 may be set to 150 ps by the set slew rate. The signal input into the gate 40A is output from the gate 40A towards the second input terminal (IN3) of the second selector 60 after 150 ps.

When the output signal from the first selector 30 is in the low level, the N-type channel transistor M46A of the differential input transistor 46 is controlled into an off state, so that an electric current flowing in the N-type channel transistor M46A becomes low. A voltage higher than the low level is applied to the gate of the N-type channel transistor M46B of the differential input transistor 46 based on the reference voltage VREF. In this case, a sink current flowing in the ground via the N-type channel transistor M46B of the differential input transistor 46 and the differential current source transistor 47 becomes high. A predetermined voltage is applied to the gate of the differential current source transistor 47 according to the electric current generated by the N-type channel transistor M54 of the electric current generating circuit 50. An electric current I4 flows in the differential current source transistor 47 due to the application of the predetermined voltage, and the low-level voltage V2 is output towards the buffer 42.

The ratio of the size of the N-type channel transistor M54 and the size of the N-type channel transistor M55 may be set to $\alpha:1$. The voltage to be applied to the gate of the differential current source transistor 47 is set to a value lower than the voltage to be applied to the gate of the differential current source transistor 27. For this reason, the value of the electric current I4 becomes smaller than the value of the electric current I2.

The delay time of the signal passing through the output terminal (OUT2) of the second selector 60 is adjusted with a delay interval (150 ps–100 ps=50 ps) according to a difference value between the delay time (150 ps) of the gate 40A and the delay time (100 ps) of the gate 20P.

A voltage V2 is output to the buffer 42 from coupling point between the drain of the P-type channel transistor M45B of the load current source transistor 45 and the drain of the N-type channel transistor M46B according to a supply current I3 or an electric current I4. The supply current I3 is from the differential current source transistor 45 which is controlled according to the electric current generated by the N-type channel transistor M53 of the electric current generating circuit 50. The electric current I4 flows in the differential current source transistor M47 which is controlled according to the electric current generated by the N-type channel transistor M54 of the electric current generating circuit 50. When the buffer 42 is controlled based on a difference in the slew rate changing according to the voltages V1 and V2, the delay time of the input signal SIN passing through the gate 40A changes.

The present invention is not limited to the aforementioned examples of various embodiments, and a part of each example may be suitably changed and embodied without departing from the scope of the present invention.

Figure 6:
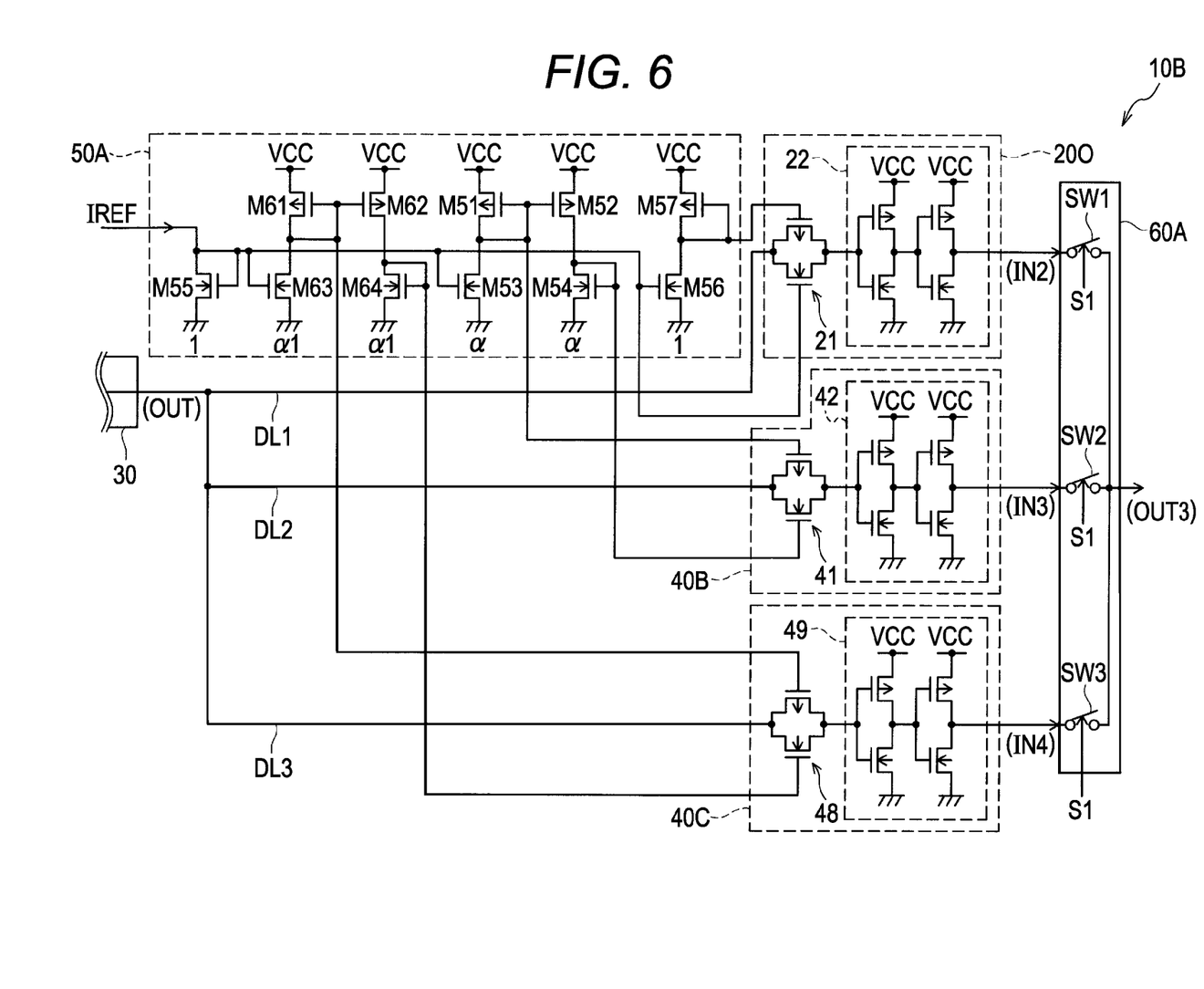
FIG. 6 illustrates a part of a delay circuit, according to another example of the embodiment of the present invention as illustrated in FIG. 1.

For example, as illustrated in FIG. 6 of a delay circuit 10B, in addition to the N-type channel transistors M53 to M56 in FIG. 2, the electric current generating circuit 50A may include N-type channel transistors M63 and M64 whose size ratio is set to $\alpha 1$ ($1(((1)$.

According to the delay circuit 10B of FIG. 6, when the ratio of the size of the N-type channel transistors M55 and M56, the size of the N-type channel transistors M53 and M54 and the size of the N-type channel transistors M63 and M64 is set to $1:(:(1$, a predetermined voltage is applied to the transfer gates included in the plurality of gates 20O, 40B and 40C coupled to the second selector 60A according to the electric currents generated by the N-type channel transistors M53 to M56, M63 and M64 based on the size ratio set by the electric current generating circuit 50A. According to the delay circuit 10B of FIG. 6, the delay times of the gates 20O, 40B and 40C occasionally vary according to the conduction states of the transfer gates 21, 41 and 48 included in the plurality of gates 20O, 40B and 40C. A reference numeral 49 is a buffer.

According to the a control method for the delay circuit 10B of illustrated in FIG. 6, when a plurality of electric currents with different current values is generated by the N-type channel transistors whose size ratios varies, the delay times of the gates 20O, 40B and 40C are occasionally adjusted differently according to the values of the generated electric current. An adjustment width of the delay times of the gates 20O, 40B and 40C is widened by a plurality of electric currents with different current values.

Like the delay circuit 10B of FIG. 6, the second selector 60A includes the first input terminal (IN2) to the third input terminal (IN4). The delay times of the gates 20O, 40B and 40C coupled to the three signal paths DL1 to DL3 from the gate 20A via the first selector 30 to the second selector 60A in the delay circuit as illustrated in FIG.1 be set differently. The signal paths DL2 and DL3 correspond to the delay stage (second delay line).

When the delay circuit 10B of FIG. 6 includes the plurality of signal paths DL1 to DL3 coupled to the gates 20O, 40B and 40C whose delay times are different, the delay times of the signals to be output from the signal paths DL1 to DL3 to the input terminals (IN2) to (IN4) of the second selector 60A are set differently. When the delay time of the gate 20O is set to 100 ps, the delay time of the gate 40B is set to 133 ps and the delay time of the gate 40C is set to 166 ps, the delay time of the signal passing through the output terminal (OUT3) of the second selector 60A according to the close state and the open state of the switches SW1 to SW3 is adjusted with a delay interval (133 ps−100 ps=33 ps) according to a difference value between the delay time of the gate 40B and the delay time of the gate 20O or with a delay interval (166 ps−133 ps=33 ps) according to a difference value between the delay time of the gate 40C and the delay time of the gate 40B.

According to the control method for the delay circuit 10B of FIG. 6, the delay times of the signals to be output from the plurality of signal paths DL1 to DL3 towards the output terminals (IN2) to (IN4) of the second selector 60A may be set to different values. For example, when three kinds of delay times (100 ps, 133 ps and 166 ps) are set, the delay time of the signal passing through the output terminal (OUT3) of the second selector 60A is adjusted with a delay interval (133 ps−100 p=33 ps or 166 ps−133 ps=33 ps) according to a difference value between the delay times according to the open state or the close state of the switches SW1 to SW3.

Instead of the delay circuit 10B of FIG. 6, four or more gates are provided between the second selector 60A and the first selector 30, so that a delay circuit may be formed. When the delay circuit includes four or more gates, the delay times of the gates are suitably set, so that the delay time of the signal passing through the output terminal (OUT3) of the second selector 60A is adjusted with a predetermined delay interval.

Figure 7:
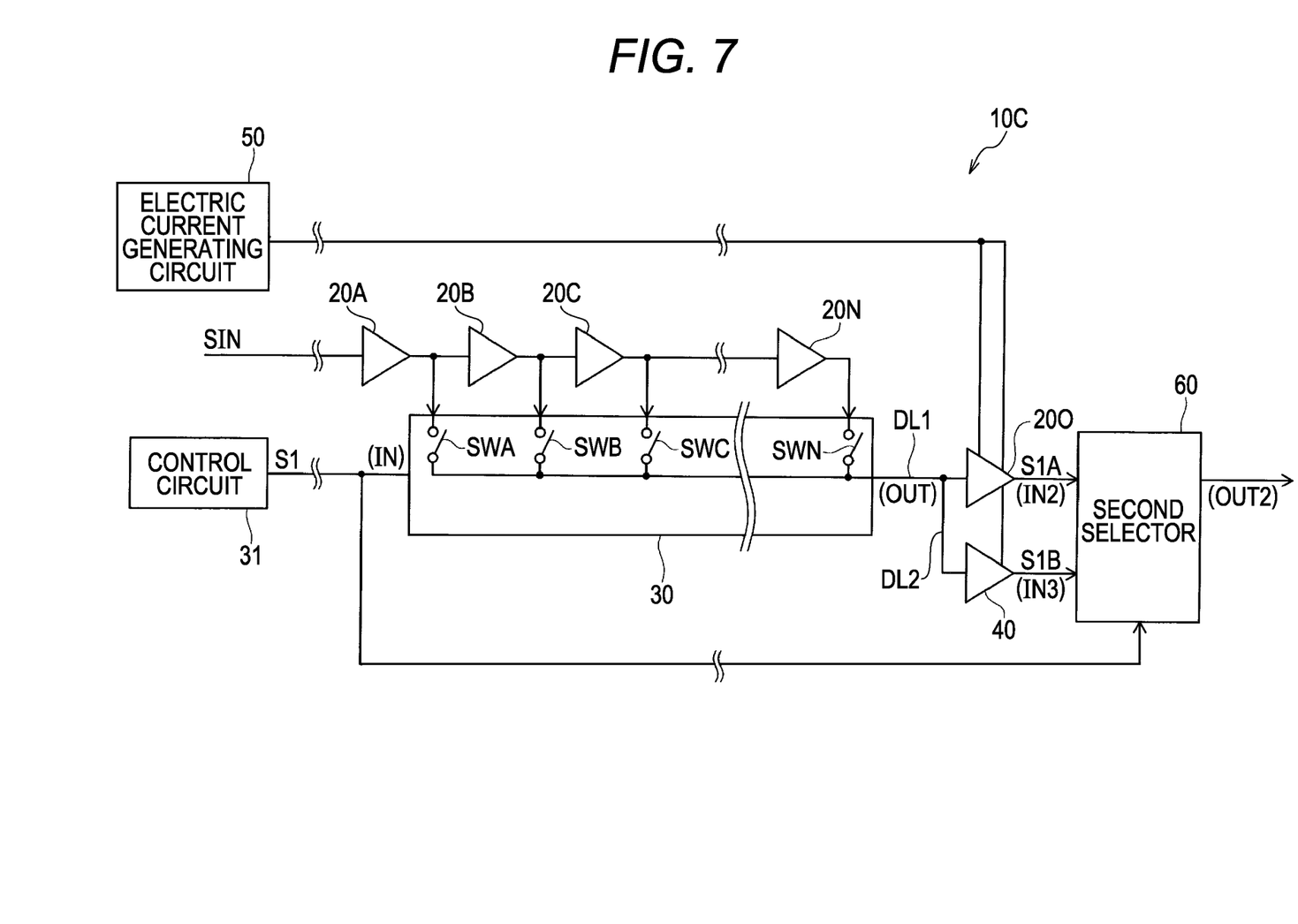
FIG. 7 illustrates a delay circuit, according to an example of yet another embodiment of the present invention.

Like a delay circuit 10C of FIG. 7, the conduction state of the transfer gate of the gate 20O and the conduction state of the transfer gate of the gate 40 are controlled by the electric current generating circuit 50. The delay time of the gate 20O may be set to 100 ps, and the delay time of the gate 40 may be set to 150 ps.

Also as to the delay circuit 10C of FIG. 7, the delay time of the signal passing through the output terminal (OUT2) of the second selector 60 is adjusted with a delay interval (50 ps) according to a difference value between the delay time of the gate 40 and the delay time of the gate 20O.

A delay adjusting section composed of the N pieces of gates 20A to 20N and the first selector 30 may be electrically coupled to the output terminal of the second selector 60.

According to the aforementioned examples of various embodiments of the present invention, the output signal selecting section selects any one of the output signal from the first delay line and the output signal from the second delay line according to a delay time selecting signal for selecting delay time of an input signal. When a delay amount of the first delay element composing the first delay line is different from a delay amount of the second delay element composing the second delay line, timing at which the output signal selecting section selects an output signal delayed from the input signal changes. The delay time of the output signal changes according to a difference in the timing at which the output signal selecting section selects an output signal.

Also, upon an output signal selecting operation, any one of the first output signal generated at the first delay operation and the second output signal generated at the second delay operation is selected according to a delay time selecting signal for selecting a delay time of an input signal. When the delay amount of the first delay element is different from the delay amount of the second delay element, the timing at which the output signal delayed from the input signal is selected changes at an output signal selecting operation.

The delay time of the output signal changes according to a difference in the timing at which the output signal is selected at the output signal selecting operation.

Any one of the output signal of the first delay element and the output signal of the second delay element is selected according to the delay time selecting signal for selecting a delay time of an input signal. When the delay amount of the first delay element is different from the delay amount of the second delay element, the timing at which the output signal selecting section selects the output signal delayed from the input signal changes.

The delay time of the output signal changes according to a difference in the timing at which the output signal selecting section selects the output signal.

When data is written as a pattern into an optical disc, timing at which a laser beam is emitted to the optical disc may be adjusted by applying various examples of the aforementioned embodiments, so that the laser beam may be emitted continuously with short interval. In this case, irregularity is not generated in an intensity distribution of the pattern on the optical disc.

Examples of embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made therein without departing from the spirit and scope of the present invention as set forth in the claims.

What is claimed is:

1. A variable delay circuit comprising:
   a first delay element configured to delay an input signal;
   a second delay element configured to delay the input signal;
   a control current supply section configured to supply control currents for adjusting a delay amount of the first delay element and a delay amount of the second delay element; and
   an output signal selecting section configured to select any one of an output signal from the first delay element and an output signal from the second delay element according to a selecting signal for selecting delay time of the input signal,
   wherein the delay amount of the second delay element is greater than the delay amount of the first delay element, and is less than twice the delay amount of the first delay element.

2. The variable delay circuit according to claim 1, further comprising:
   a delay unit that includes a plurality of delay elements,
   wherein the delay unit is coupled to input terminals of the first delay element and the second delay element or to an output terminal of the output signal selecting section.

3. The variable delay circuit according to claim 2,
   wherein the delay amount of the first delay element and a delay amount of the plurality of delay elements are substantially the same.

4. The variable delay circuit according to claim 1,
   wherein the control current supply section includes a current mirror circuit,
   wherein the current mirror circuit includes an output transistor configured to output the control current having a desired current ratio with respect to a reference current.

5. The variable delay circuit according to claim 1,
   wherein the second delay element comprises:
      a first buffer circuit coupled to the output signal selecting section; and a control voltage generating section configured to generate a control voltage for controlling a conduction state of the first buffer circuit according to the control current.

6. The variable delay circuit according to claim 5,
wherein the control voltage generating section includes a first transfer gate having a conduction state which is controlled according to the control current,
wherein an output voltage of the first transfer gate is to be supplied to the first buffer circuit.

7. The variable delay circuit according to claim 4,
wherein the control current supply section includes a plurality of current mirror circuits,
wherein output transistors in the plurality of current mirror circuits are configured to output the control currents having desired current ratios that are different.

8. The variable delay circuit according to claim 2 comprising:
a third delay element configured to delay the input signal,
wherein the control current supply section is configured to supply the control currents with the third delay element, the control current adjusting a delay amount of the third delay element;
the output signal selecting section is configured to select any one of the output signals from the first delay element, the second delay element and the third delay element according to a selecting signal for selecting delay time of the input signal;
wherein the delay unit is coupled to input terminals of the first delay element, the second delay element and the third delay element or to an output terminal of the output signal selecting section; and
wherein the delay amount of the third delay element is greater than the delay amount of the first delay element, and is less than twice the delay amount of the first delay element,
wherein the delay amount of the second delay element is different from the delay amount of the third delay element.

9. The variable delay circuit according to claim 1,
wherein the second delay element comprises:
an electric current source transistor having a supply current which is controlled according to the control current;
a differential current source transistor having an operation current which is controlled according to the control current;
a differential circuit outputting a differential voltage according to the supply current or the operation current; and
a second buffer circuit coupled to the output signal selecting section and supplied with the differential voltage.

10. The variable delay circuit according to claim 2,
wherein the first delay element and the plurality of delay elements comprise:
a second transfer gate having a conduction state which is controlled according to the control current; and
a third buffer circuit supplied with an output voltage which is output from the second transfer gate.

11. A delay amount control method comprising:
generating a first output signal delayed from an input signal;
generating a second output signal delayed from the input signal;
supplying control currents for adjusting a first delay amount of the first output signal with respect to the input signal and a second delay amount of the second output signal with respect to the input signal; and
selecting any one of the first output signal and the second output signal according to a selecting signal for selecting delay time of the input signal,
wherein the delay amount for the second output signal is greater than the delay amount for the first output signal, and is less than twice the delay amount for the first output signal.

12. The delay amount control method according to claim 11,
wherein the supplying includes configuring the control currents to exhibit desired ratios with respect to a reference current.

13. The delay amount control method according to claim 12,
wherein the desired current ratios with respect to a reference current are different from each other.

14. The delay amount control method according to claim 11 comprising;
generating a third output signal delayed from the input signal,
in the selecting, any one of the first output signal, the second output signal, and the third output signal according to a selecting signal for selecting delay time of the input signal,
wherein the delay amount for the second output signal is different from the delay amount for the third output signal.

* * * * *